(12) United States Patent
Zhang

(10) Patent No.: US 10,886,174 B2
(45) Date of Patent: Jan. 5, 2021

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Cheng Long Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/363,383

(22) Filed: Mar. 25, 2019

(65) Prior Publication Data

US 2019/0304830 A1    Oct. 3, 2019

(30) Foreign Application Priority Data

Apr. 3, 2018  (CN) .......................... 2018 1 0303786

(51) Int. Cl.
*H01L 21/768* (2006.01)
*H01L 21/48* (2006.01)

(52) U.S. Cl.
CPC ........ *H01L 21/7688* (2013.01); *H01L 21/486* (2013.01); *H01L 21/76843* (2013.01)

(58) Field of Classification Search
None
See application file for complete search history.

(56) References Cited

U.S. PATENT DOCUMENTS

| | | | | |
|---|---|---|---|---|
| 2014/0099792 | A1* | 4/2014 | Bergendahl | H01L 21/3086 438/696 |
| 2014/0213033 | A1* | 7/2014 | Brunco | H01L 21/762 438/400 |
| 2015/0147882 | A1* | 5/2015 | Yao | H01L 21/76805 438/675 |
| 2015/0287634 | A1* | 10/2015 | Agarwal | H01L 21/32139 438/720 |
| 2018/0025943 | A1* | 1/2018 | Burns | H01L 21/76811 438/629 |

* cited by examiner

*Primary Examiner* — Nilufa Rahim
(74) *Attorney, Agent, or Firm* — Anova Law Group, PLLC

(57) ABSTRACT

Semiconductor structure and fabrication method are provided. An exemplary method includes: providing a to-be-etched layer; forming a first mask material layer with a barrier region on the to-be-etched layer; forming a first mask groove and a second mask groove separated from each other in the first mask material layer and exposing two sidewalls of the barrier region along an extending direction of the first mask groove; forming barrier layers on exposed sidewalls of the barrier region; forming a first mask through hole in the barrier region of the first mask material layer by etching a portion of the barrier region of the first mask material layer by using the barrier layers as a mask; and forming a first groove, a second groove, and a through hole, by etching the to-be-etched layer using the barrier layers and the first mask material layer as a mask.

20 Claims, 6 Drawing Sheets

SEMICONDUCTOR DEVICE AND FABRICATION METHOD THEREOF

CROSS-REFERENCES TO RELATED APPLICATION

This application claims the priority of Chinese Patent Application No. 201810303786.2, filed on Apr. 3, 2018, the content of which is incorporated herein by reference in its entirety.

TECHNICAL FIELD

The present disclosure generally relates to the field of semiconductor technologies and, more particularly, relates to a semiconductor device and its fabrication method.

BACKGROUND

Interconnection structures are often formed during semiconductor integrated circuit manufacturing process, to electrically connect an upper material layer with a bottom material layer. An interconnection structure usually includes conductive layers and conductive plugs. The conductive layers are formed in grooves and the conductive plugs are formed in through holes.

Positions of the through holes and the grooves are determined according to design needs. Some through holes may have to be formed between adjacent grooves and have to be separated from the grooves.

However, the conventionally-formed interconnection structures have undesirable performance.

SUMMARY

One aspect of the present disclosure provides a fabrication method of a semiconductor structure. The method includes: providing a to-be-etched layer; forming a first mask material layer with a barrier region on the to-be-etched layer; forming a first mask groove and a second mask groove separated from each other in the first mask material layer and exposing two sidewalls of the barrier region along an extending direction of the first mask groove; forming barrier layers on exposed sidewalls of the barrier region; forming a first mask through hole in the barrier region of the first mask material layer by etching a portion of the barrier region of the first mask material layer by using the barrier layers as a mask; and after forming the first mask through hole, etching the to-be-etched layer by using the barrier layers and the first mask material layer as a mask, to form a first groove in the to-be-etched layer at a bottom of the first mask groove, a second groove in the to-be-etched layer at a bottom of the second mask groove, and a through hole in the to-be-etched layer at a bottom of the first mask through hole. The first mask groove and the second mask groove extend along a direction parallel to an arrangement direction of the first mask groove and the second mask groove, and the first mask groove and the second mask groove are disposed at two sides of the barrier region respectively.

Another aspect of the present disclosure provides a semiconductor structure formed by the disclosed method.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
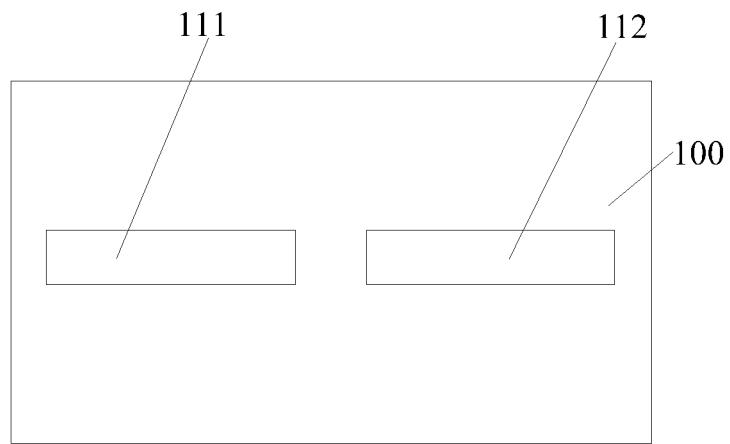
FIGS. 1-2 illustrate semiconductor structures corresponding to certain stages for forming a semiconductor device.
Figure 2:
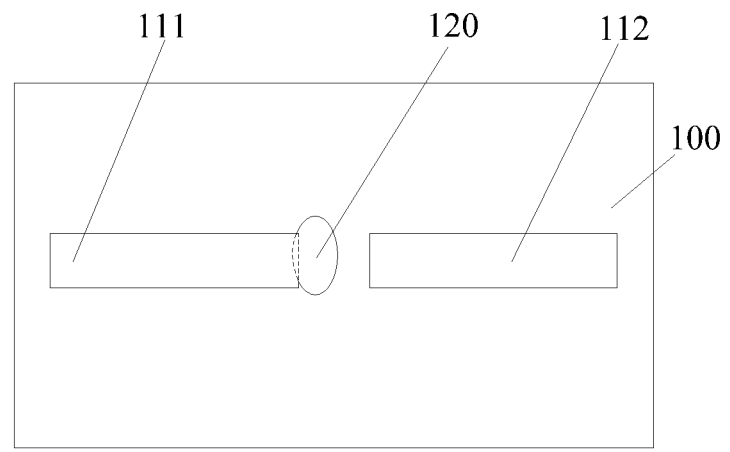

FIGS. 1-2 illustrate semiconductor structures corresponding to certain stages for forming a semiconductor device.

As illustrated in FIG. 1, a to-be-etched layer 100 may be provided. A first groove 111 and a second groove 112 separated from each other may be formed in the to-be-etched layer 100 by etching a portion of the to-be-etched layer 100. The first groove 111 and the second groove 112 may extend along a direction parallel to an arrangement direction between the first groove 111 and the second groove 112.

As illustrated in FIG. 2, a through hole 120 may be formed in the to-be-etched layer 100 between the first groove 111 and the second groove 112.

A first conductive layer may be formed in the first groove 111 and a second conductive layer may be formed in the second groove 112. A conductive plug may be formed in the through hole 120.

However, the formed semiconductor device has poor performance. When sizes of semiconductor devices continuously decrease, a distance between the first groove 111 and the adjacent second groove 112 also continuously decreases, and becomes smaller than a resolution limit of a lithography process. The through hole 120 has to be formed in the to-be-etched layer 100 between the first groove 111 and the second groove 112. The first groove 111 and the second groove 112 are formed in a process different from a process for forming the through hole 120.

When forming the through hole 120, because of a limit of the lithography resolution, an alignment error will happen between the through hole 120 and the to-be-etched layer 100 between the first groove 111 and the second groove 112. The through hole 120 may become connected to either the first groove 111 or the second groove 112 easily. Correspondingly, the conductive plug may be electrically connected to either the first conductive layer or the second conductive layer easily, to induce a leakage. The formed semiconductor device has a poor performance.

The present disclosure provides a fabricating method for forming a semiconductor device to at least partially alleviate above problems. The method may include: forming barrier layers on exposed sidewalls of a barrier region; etching a portion of the barrier region in a first mask material layer by using the barrier layers as a mask to form a first mask through hole in the barrier region of the first mask material layer; etching a to-be-etched layer by using the barrier layers and the first mask material layer as a mask, to form a first groove in the to-be-etched layer at a bottom of a first mask groove, to form a second groove in the to-be-etched layer at a bottom of a second mask groove, and to form a through hole in the to-be-etched layer at a bottom of the first mask through hole.

Figure 3:
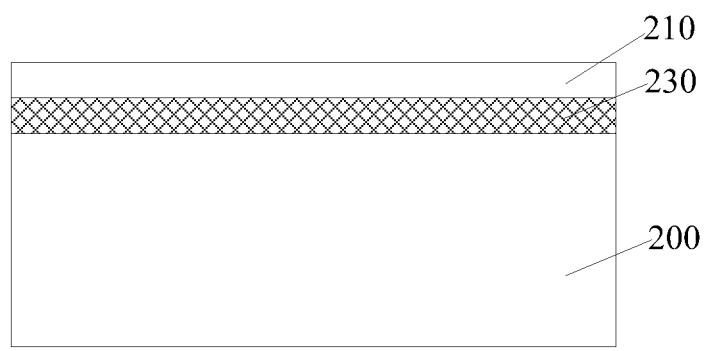
FIGS. 3-15 illustrate semiconductor structures corresponding to certain stages for forming an exemplary semiconductor device according to various disclosed embodiments of the present disclosure.
Figure 16:
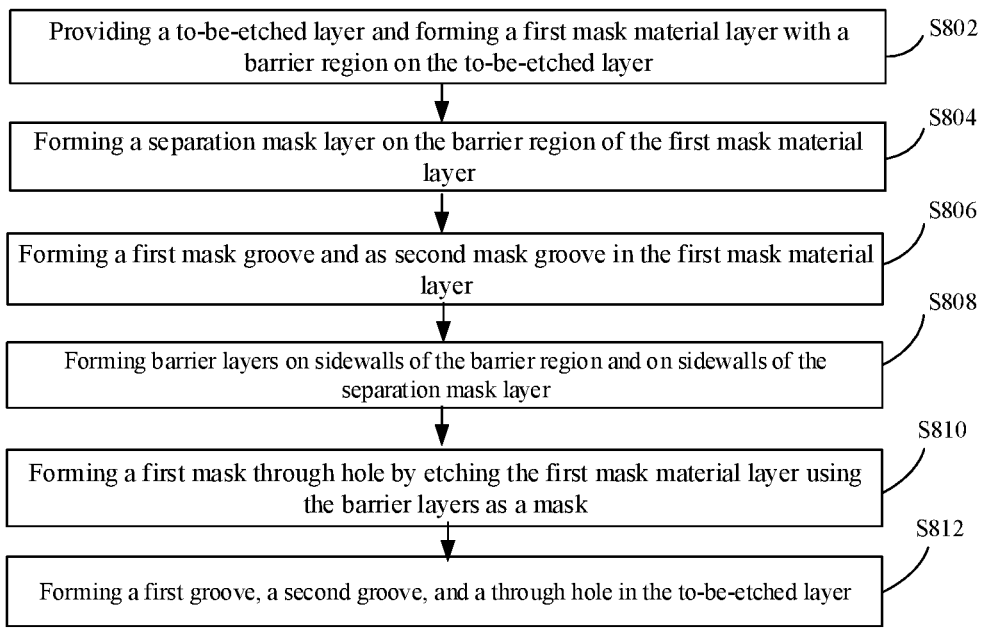
FIG. 16 illustrates an exemplary method for forming an exemplary semiconductor device according to various disclosed embodiments of the present disclosure.

As illustrated in FIG. 3, a to-be-etched layer 200 may be provided (e.g. in Step S802 in FIG. 16). The to-be-etched layer 200 may be made of a dielectric material including SiO$_2$ and/or low-k dielectric material with a dielectric constant k smaller than 3.9. In some other embodiments, the to-be-etched layer 200 may be made of a semiconductor material including silicon or silicon germanium.

As illustrated in FIG. 3, a first mask material layer 210 may be formed on the to-be-etched layer 200 (e.g. in Step S802 in FIG. 16). The first mask layer 210 may include a barrier region and the barrier region may be used to form a first mask through hole.

The first mask material layer 210 may be made of a material including SiO$_2$ and/or SiCO.

A first mask groove and a second mask groove discrete from the first mask groove may be formed in the first mask material layer 210. The first mask groove and the second mask groove may extend along a direction parallel to an arrangement direction of the first mask groove and the second mask groove. The first mask groove and the second mask groove may be formed at two sides of the barrier region respectively. The first mask groove and the second mask groove may expose sidewalls of the barrier region along an extending direction of the first mask groove.

In one embodiment, the fabrication method may further include forming a separation mask layer on the barrier region of the first mask material layer before forming the first mask groove and the second mask groove. The first mask groove and the second mask groove may be formed in the first mask material layer 200 by etching a portion of the first mask material layer 210 at sides of the barrier region. The separation mask layer may be removed before subsequently forming a first mask through hole.

In one embodiment, the fabrication method may further include forming a second mask material layer 230 on the to-be-etched layer 200 before forming the first mask material layer 210. The first mask material layer 210 may be formed on the second mask material layer 230.

The second mask material layer 230 may be made of a material different from the first mask material layer 210.

The second mask material layer 230 may be made of a material including TiN, AlN, CuN, and/or BN.

The second mask material layer 230 may be made of a hard mask material. A third mask groove, a fourth mask groove, and a second mask through hole may be subsequently formed in the second mask material layer 230. Then the to-be-etched layer 200 may be etched. When etching the to-be-etched layer 200, a change of a profile of the third mask groove, of the fourth mask groove, and of the second mask through hole, may be small. Patterns transferred to the to-be-etched layer 200 (including a first groove, a second groove, and a through hole) may have a good quality.

In some other embodiments, the second mask material layer may be not formed.

Figure 4:
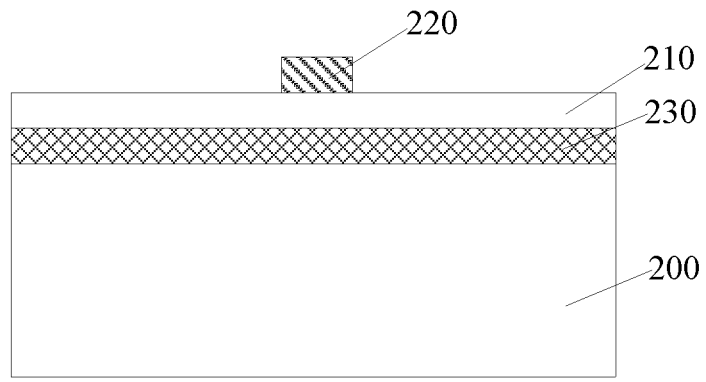
Figure 5:
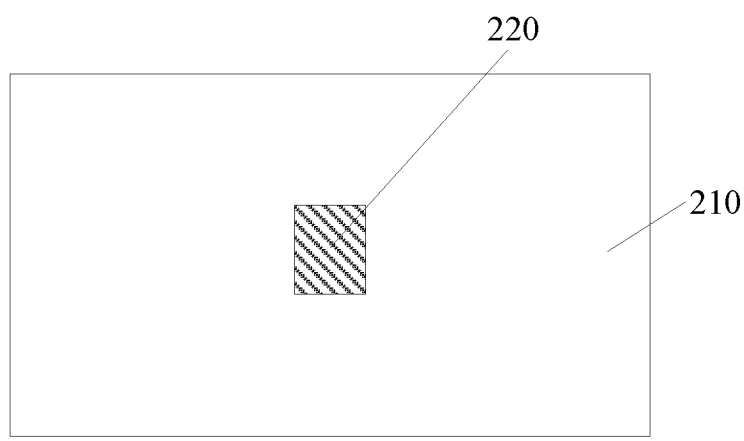

FIG. 4 is based on FIG. 3 and FIG. 5 is a top view of FIG. 4 from a top of a separation mask layer. As illustrated in FIGS. 4-5, a separation mask layer 220 may be formed on the barrier region of the first mask material layer 210 (e.g., in Step S804 in FIG. 16).

The separation mask layer 220 may be made of a material including TiN, AlN, CuN, and/or BN.

The separation mask layer 220 may be made of a hard mask material. When etching a portion of the first mask material layer 210 at sides of the barrier region by using the separation mask layer 220 as the mask, a change in a pattern of the separation mask layer 220 may be small and the separation mask layer may have a good mask performance.

The separation mask layer 220 may be formed by: forming a separation mask material layer on the whole top surface of the first mask material layer 210; and removing a portion of the separation mask material layer to form the separation mask layer 220.

A width direction of the separation mask layer 220 may be parallel to the arrangement direction of the first mask groove and the second mask groove. A length direction of the separation mask layer 220 may be perpendicular to the arrangement direction of the first mask groove and the second mask groove.

A width of the separation mask layer 220 may be equal to a size of the barrier region along a direction parallel to the extending direction of the first mask groove and the second mask groove. A length of the separation mask layer 220 may be equal to another size of the barrier region along a direction perpendicular to the extending direction of the first mask groove and the second mask groove but parallel to a top surface of the to-be-etched layer 200.

Figure 6:
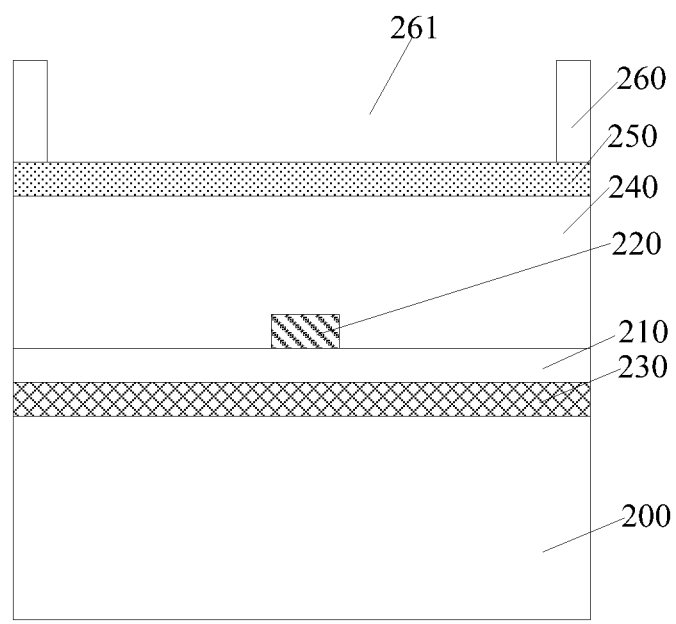

As illustrated in FIG. 6 based on FIG. 4, a first planarized layer 240 may be formed on the first mask material layer 210 and on the separation mask layer 220. Subsequently, a bottom anti-reflection layer 250 may be formed on the first planarized layer 240 and a first photoresist layer 260 may be formed on the bottom anti-reflection layer 250. The first photoresist layer 260 may have a first opening 261. The first opening 261 may be located on the separation mask layer 220 and on a portion of the first mask material layer 210 at sides of the separation mask layer 220.

In one embodiment, the first opening 261 may be located on the separation mask layer 220 and on a portion of the first mask material layer 210 at sides of the separation mask layer 220 along a width direction of the separation mask layer 220.

An extending direction of the first opening 261 may be parallel to the arrangement direction of the first mask groove and the second mask groove.

Figure 7:
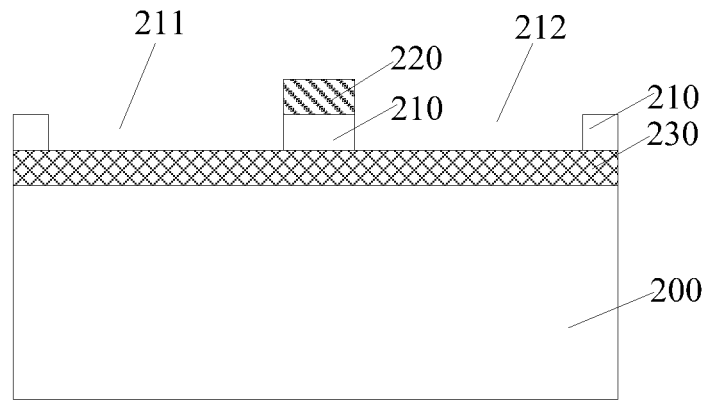

As illustrated in FIG. 7, The first bottom anti-reflection layer 250 and the first planarized layer 240 at a bottom of the first opening 261 may be etched by using the first photoresist layer 260 as a mask to expose a top surface of the first mask material layer 210 and a top surface of the separation mask layer 220 and to form first middle openings in the first planarized layer 240 at the bottom of the first opening 261. The first middle openings may be located at sides of the separation mask layer 220. Subsequently, a portion of the first mask material layer 210 at bottoms of the first middle openings may be etched by using the first planarized layer 240 and the separation mask layer 220 as a mask, to form a first mask groove 211 and a second mask groove 212 discrete from each other in the first mask material layer 210. The first mask groove 211 and the second mask groove 212 may be located at two sides of the separation mask layer 220 respectively (e.g. in Step S806 in FIG. 16).

An extending direction of the first mask groove 211 and an extending direction of the second mask groove 221 may be both parallel to an arrangement direction of the first mask groove 211 and the second mask groove 212. The first mask groove 211 and the second mask groove 212 may be located at two sides of the barrier region respectively.

Figure 8:
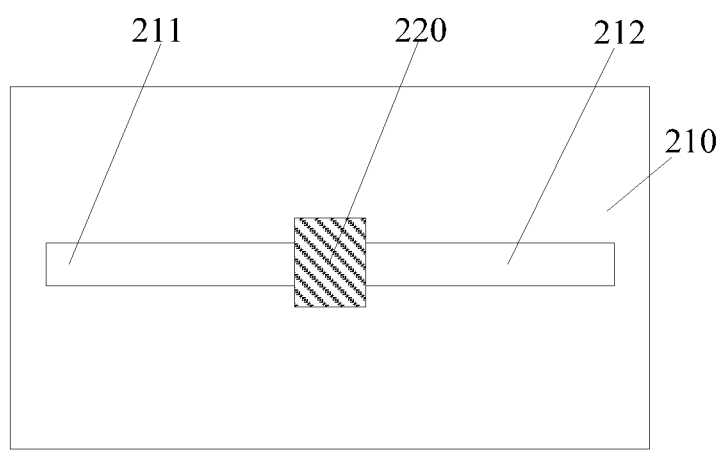

FIG. 8 is a top view of FIG. 7 from the top of the separation mask layer 220.

In the present disclosure, a distance between the first mask groove 211 and the second mask groove 212 may be small, and the first mask groove 211 and the second mask groove 212 may be smaller than a limit of a lithography resolution. Based on forming the separation mask layer 220, the first mask groove 211 and the second mask groove 212 may be formed in the same etching process. Two independent etching processes to form the first mask groove 211 and the second mask groove 212 separately may be avoided. The etching process may be simplified and a misalignment problem of the first mask groove 211 relative to the second mask groove 212 may be avoided.

In one embodiment, before removing the separation mask layer 220, the first planarized layer, the first bottom anti-reflection layer and the first photoresist layer may be removed.

In one embodiment, the first planarized layer 240, the first bottom anti-reflection layer 250 and the first photoresist layer 260 may be removed after forming the first mask groove 211 and the second mask groove 212. In some other embodiments, the first photoresist layer 260 and the first bottom anti-reflective layer 250 may be removed when forming the first middle openings, and the first planarized layer 240 may be removed after forming the first mask groove 211 and the second mask groove 212 but before removing the separation mask layer 220.

Subsequently, barrier layers may be formed on exposed sidewalls of the barrier region.

In one embodiment, the separation mask layer 220 may be removed after forming the barrier layers. The barrier layers may be also formed on sidewalls of the separation mask layer 220 before removing the separation mask layer 220.

Figure 9:
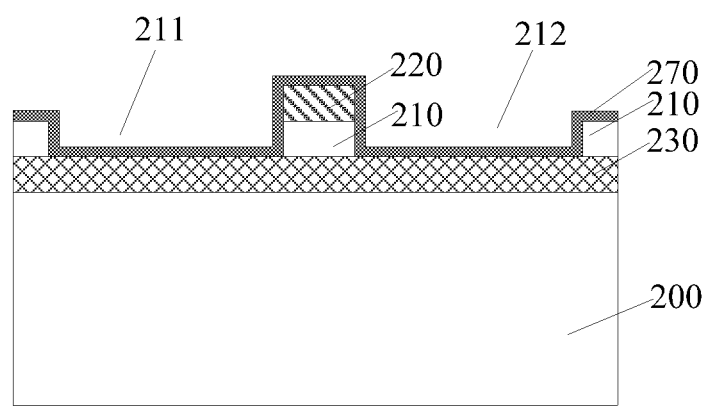
Figure 10:
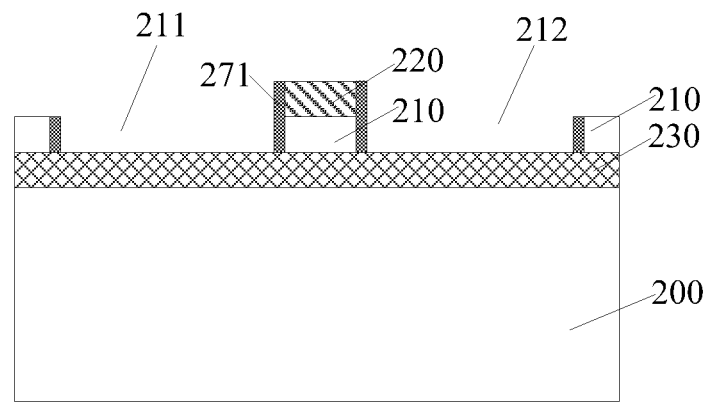

FIGS. 9-10 illustrate the processes to form the barrier layers (e.g. in Step S808 in FIG. 16).

As illustrated in FIG. 9, a barrier material layer 270 may be formed on the sidewalls of the barrier region, the sidewalls and the top surface of the separation mask layer 220, inner sidewalls of the first mask groove 211, and inner sidewalls of the second mask groove 212.

In one embodiment, the barrier material layer 270 may be further formed on a surface of the first mask material layer 210 outside the barrier region.

The barrier material layer 270 may be made of a material different from the material of the first mask material layer and different from a material of the second mask material layer 230.

In one embodiment, the barrier material layer 270 may be made of a material including SiN and/or SiNO.

In one embodiment, the barrier material layer 270 may have a thickness of about 5 Å to about 20 Å, such as 8 Å, 10 Å, 15 Å, and 20 Å. If the thickness of the barrier material layer 270 is larger than 20 Å, a process may be wasted and a cost may increase, and the barrier material layer 270 may occupy a large space of the first mask groove 211 and the second mask groove 212. If the thickness of the barrier material layer 270 is smaller than 5 Å, the subsequent barrier layers may have a bad mask capability.

The barrier material layer 270 may be formed by a deposition process including an atomic layer deposition process and/or a sputtering process.

In one embodiment, the barrier material layer 270 may be formed by an atomic layer deposition process and the thickness of the formed barrier material layer 270 is highly uniform. A film quality of the barrier material layer 270 may be good, too.

As illustrated in FIG. 10, a portion of the barrier material layer 270 may be etched back to expose the top surface of the separation mask layer 200, a bottom surface of the first mask groove 211 and a bottom surface of the second mask groove 212. A remaining portion of the barrier material layer 270 may be used as barrier layers 271 on sidewalls of the barrier region and on sidewalls of the separation mask layer 220.

The barrier layers 271 may be formed on both sidewalls of the barrier region along an extending direction of the first mask groove 211.

In one embodiment, a portion of the barrier material layer 270 may be etched back further to expose the top surface of the first mask material layer 210 outside the barrier region. The barrier layers 271 may be further formed on sidewalls of the first mask groove 211 and on sidewalls of the second mask groove 212.

The barrier layers 271 may be made of a material including SiN and/or SiNO.

The barrier layers 271 may have a thickness similar to the thickness of the barrier material layer 270.

In one embodiment, the separation mask layer 220 may be removed after forming the barrier layers 271, and the barrier material layer 270 may be further formed on the sidewalls and the top surface of the separation mask layer 220. When etching-back the barrier material layer 270 to form the barrier layers 271, a height loss of the barrier layers 271 on the sidewalls of the barrier region may be avoided. Before subsequently removing the separation mask layer 220, the barrier layers 271 may completely cover the exposed sidewalls of the barrier region. After removing the barrier layers 271 on the sidewalls and the top surface of the separation mask layer 220, a loss of the barrier layers 271 on the sidewalls of the barrier region may be small. The mask performance of the barrier layers 271 may be improved.

Figure 11:
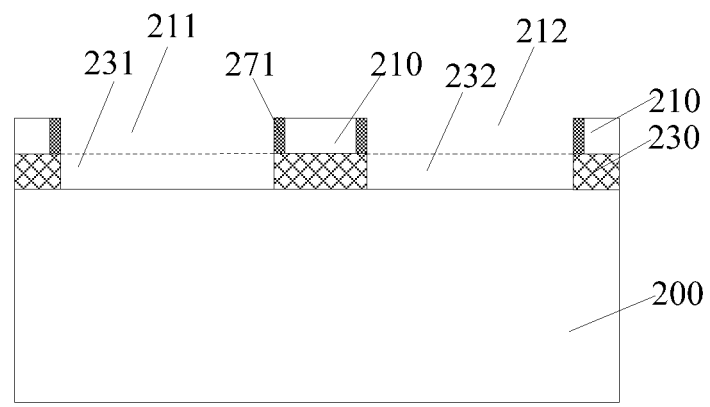

As illustrated in FIG. 11, the separation mask layer 220 may be removed by etching (e.g. in Step S810 in FIG. 16). In one embodiment, the barrier layers 271 on the sidewalls and the top surface of the separation mask layer 220 may be removed too when removing the separation mask layer 220 by etching.

The separation mask layer 220 may have an etching resistance similar to an etching resistance of the second mask material layer 230. When removing the separation mask layer 220 by etching, a portion of the second mask material layer 230 at the bottom of the first mask groove 211 and at the bottom of the second mask groove 212 may be etched, too. Correspondingly, a third mask groove 231 may be formed in the second mask material layer 230 at the bottom of the first mask groove 211, and a fourth mask groove 232 may be formed in the second mask material layer 230 at the bottom of the second mask groove 212. The fabrication process may be simplified.

The separation mask layer 220 may be made of a material including TiN, AlN, CuN, and/or BN.

In one embodiment, the separation mask layer 220 may be made of a material same as the material of the second mask material layer 230. In other embodiments, the separation mask layer 220 may be made of a material different from the material of the second mask material layer 230.

Subsequently, a portion of the barrier region of the first mask material layer 210 may be etched by using the barrier layers 271 as a mask, to form a first mask through hole in the barrier region of the first mask material layer 210 (e.g. in Step S810 in FIG. 16).

In one embodiment, the second mask material layer 230 may be formed and then the first mask through hole may be formed after forming the third mask groove 231 and the fourth mask groove 232. The method may further include etching the second mask material layer 230 at a bottom of the first mask through hole by using the barrier layers 271 as the mask, to form a second mask through hole in the second mask material layer 230 at the bottom of the first mask through hole.

Figure 12:
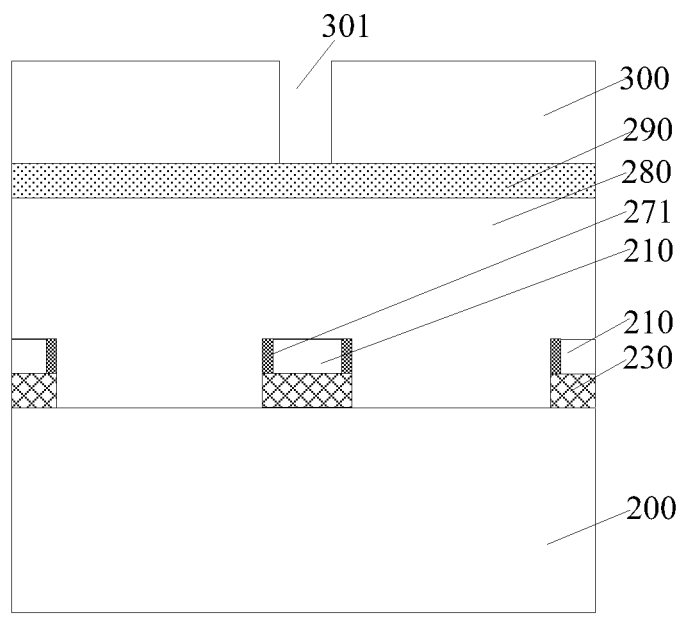

As illustrated in FIG. 12, a second planarized layer 280 may be formed in the third mask groove 231, in the fourth mask groove 232, on the first mask material layer 210, and on the barrier layers 271. A second bottom anti-reflection layer 290 may be formed on the second planarized layer 280 and a second photoresist layer 300 may be formed on the second bottom anti-reflective layer 290. The second photoresist layer 300 may have a second opening 301 above the barrier region.

The second opening 301 may define a position of the first mask through hole and of the second mask through hole.

Figure 13:
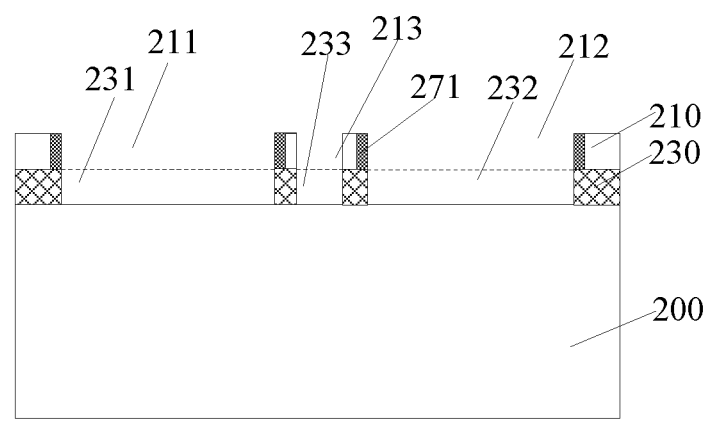
Figure 14:
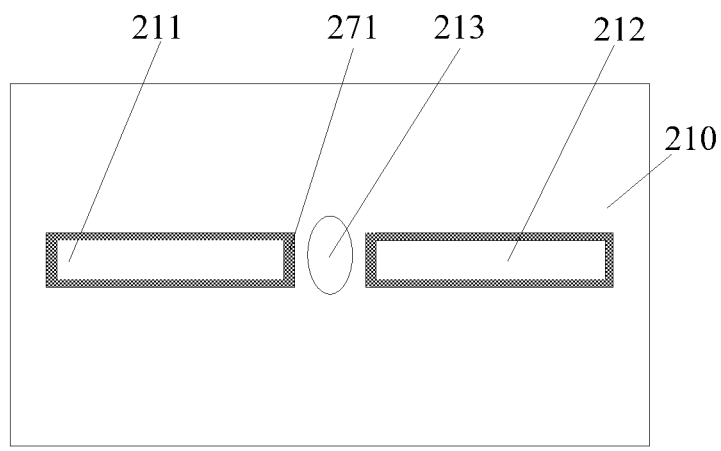

FIG. 13 shows a semiconductor structure corresponding to Step S810 in FIG. 16 and FIG. 14 is a top view of FIG. 13 from the top of the first mask material layer 210. As illustrated in FIG. 13 and FIG. 14, the second bottom anti-reflection layer 290 and the second planarized layer 280 at a bottom of the second opening 301 may be etched by using the second photoresist layer 300 as a mask, to expose a top surface of the barrier region in the first mask material layer 210 and to form a second middle opening in the second planarized layer 280 at a bottom of the second opening 301. Subsequently, a portion of the barrier region in the first mask material layer 210 at a bottom of the second middle opening may be etched by using the second planarized layer 280 and the barrier layers 271 as a mask, to form a first mask through hole 213 in the barrier region of the first mask material layer 210. Then the second mask material layer 230 at a bottom of the first mask through hole 213 may be etched by using the second planarized layer 280 and the barrier layers 271 as a mask, to form a second mask through hole 233 in the second mask material layer 230 at a bottom of the first mask through hole 213 (e.g. in Step S810 in FIG. 16).

When forming the first mask through hole 213, the barrier layers 271 may be used as the mask. The barrier layers 271 may be formed on the sidewalls of the barrier region. When forming the first mask through hole 213, the first mask through hole 213 may be not connected to the first mask groove 211 or to the second mask groove 212 even if a center of the first mask through hole deviates from a center of the barrier region along an extending direction of the first mask groove 211 and the second mask groove 212. Of course, in one embodiment, the first mask through hole 213 may be in the center of the barrier region between the first mask groove 211 and the second mask groove 212. For example, a center-to-center distance between the first mask through hole 213 and the first mask groove 211 may substantially equal to a center-to-center distance between the first mask through hole 213 and the second mask groove 212.

Before etching the to-be-etched layer by using the barrier layers, the first mask material layer and the second mask material layer as a mask, the second planarized layer, the second bottom anti-reflection layer and the second photoresist layer may be removed.

In one embodiment, the second planarized layer 280, the second bottom anti-reflection layer 290 and the second photoresist layer 300 may be removed after forming the second mask through hole 233. In some other embodiments, the second bottom anti-reflection layer 290 and the second photoresist layer 300 may be removed when forming the second middle opening. The second planarized layer 280 may be removed after forming the second mask through hole 233.

Figure 15:
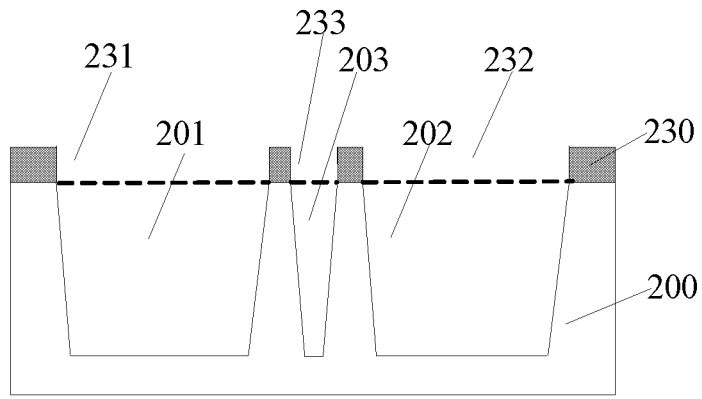

As illustrated in FIG. 15, after forming the first mask through hole 213, the to-be-etched layer 200 may be etched by using the barrier layers 271 and the first mask material layer 210 as a mask. Then a first groove 201 may be formed in the to-be-etched layer 200 at a bottom of the first mask groove 211 and a second groove 202 may be formed in the to-be-etched layer 200 at a bottom of the second mask groove 212. A through hole 203 may be formed in the to-be-etched layer 200 at a bottom of the first mask through hole 213 (e.g. in Step S812 in FIG. 16).

In one embodiment, the to-be-etched layer 200 may be etched, by using the barrier layers 271, the first mask material layer 210, and the second mask material layer 230 as a mask. Correspondingly, a first groove 201 may be formed in the to-be-etched layer 200 at a bottom of the first mask groove 211 and of the third mask groove 231. A second groove 202 may be formed in the to-be-etched layer 200 at a bottom of the second mask groove 212 and of the fourth mask groove 233. A through hole 203 may be formed in the to-be-etched layer 200 at a bottom of the first mask through hole 213 and of the second mask through hole 233.

In the present disclosure, the first mask through hole 213 may be not connected to the first mask groove 211 or to the second mask groove 212. Correspondingly, the through hole 203 may be not connected to the first groove 201 or to the second groove 202.

In one embodiment, the method may further include forming a first conductive layer in the first groove, forming a second conductive layer in the second groove and forming a conductive plug in the through hole.

The present disclosure also provides a semiconductor device formed by the above method.

The present disclosure also provides another method for forming a semiconductive device. Processes in this method different from the previous method are listed following.

The separation mask layer may be removed before forming the barrier layers.

After forming the barrier layer, a portion of the barrier region in the first mask material layer 210 may be etched by using the barrier layers 271 as a mask, to form the first mask through hole 213 in the barrier region of the first mask material layer 210. Then, the to-be-etched layer 200 may be etched, by using the barrier layers 271 and the first mask material layer 210 as a mask. Correspondingly, the first groove 201 may be formed in the to-be-etched layer 200 at a bottom of the first mask groove 211 and of the third mask groove 231. The second groove 202 may be formed in the to-be-etched layer 200 at a bottom of the second mask groove 212. The through hole 203 may be formed in the to-be-etched layer 200 at a bottom of the first mask through hole 213.

In embodiments including forming the second mask material layer 230, a portion of the second mask material layer 230 at the bottom of the first mask groove 211 and at the bottom of the second mask groove 212 may be etched, too. Correspondingly, a third mask groove 231 may be formed in the second mask material layer 230 at the bottom of the first mask groove 211, and a fourth mask groove 232 may be formed in the second mask material layer 230 at the bottom of the second mask groove 212. The second mask through hole 233 may be formed in the second mask material layer 230 at a bottom of the first mask through hole 213. Then the to-be-etched layer 200 may be etched, by using the barrier layers 271, the first mask material layer 210, and the second mask material layer 230 as a mask. Correspondingly, a first groove 201 may be formed in the to-be-etched layer 200 at a bottom of the first mask groove 211 and of the third mask groove 231. A second groove 202 may be formed in the to-be-etched layer 200 at a bottom of the second mask groove 212 and of the fourth mask groove 233. A through hole 203 may be formed in the to-be-etched layer 200 at a bottom of the first mask through hole 213 and of the second mask through hole 233.

The present disclosure also provides a semiconductor device formed by the above method. The semiconductor structure may include: a to-be-etched layer; a second mask material layer on the to-be-etched layer with a third mask groove and a fourth mask groove discrete from each other; a first groove in the to-be-etched layer at a bottom of the third mask groove; a second groove in the to-be-etched layer at a bottom of the fourth mask groove; a second mask through hole in the second mask material layer between the third mask groove and the fourth mask groove discrete; and a through hole in the to-be-etched layer at a bottom of the second mask through hole.

In the present disclosure, the method may include forming the barrier layers on the exposed sidewalls of the barrier region and etching the portion of the barrier region in the first mask material layer by using the barrier layers as a mask to form the first mask through hole in the barrier region of the first mask material layer. Since the barrier layers may be used as the mask when forming the first mask through hole, the first mask through hole may not be connected to the first mask groove or the second mask groove even if the center of the first mask through hole and the center of the barrier region have an alignment error along the extending direction of the first mask groove the second mask groove. Correspondingly, a connection between the through hole and the first groove or a connection between the through hole and the second groove may be avoided. The process design demands may be satisfied and the performance of the semiconductor device may be improved.

Further, based on the separation mask layer, one single etching process may be used to form the first mask groove and the second mask groove simultaneously. Two separated processes to form the first mask groove and the second mask groove one by one may be simplified. The etching process may be simplified and a position misalignment of the first mask groove corresponding to the second mask groove may be avoided.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method of a semiconductor device, comprising:
   providing a to-be-etched layer;
   forming a first mask material layer on the to-be-etched layer, wherein the first mask material layer includes a barrier region;
   forming a first mask groove and a second mask groove separated from each other by the barrier region in the first mask material layer, wherein:
      the first mask groove and the second mask groove extend along an extending direction parallel to an arrangement direction of the first mask groove and the second mask groove;
      the first mask groove and the second mask groove are disposed at two sides of the barrier region respectively; and
      the first mask groove and the second mask groove expose two sidewalls of the barrier region along the extending direction of the first mask groove;
   forming barrier layers on exposed sidewalls of the barrier region;
   forming a first mask through hole in the barrier region of the first mask material layer by etching a portion of the barrier region of the first mask material layer by using the barrier layers as a mask; and
   after forming the first mask through hole, etching the to-be-etched layer by using the barrier layers and the first mask material layer as a mask, to form a first groove in the to-be-etched layer at a bottom of the first mask groove, a second groove in the to-be-etched layer at a bottom of the second mask groove, at the two sides of the barrier region, symmetrically, and a through hole in the to-be-etched layer at a bottom of the first mask through hole through the barrier region.

2. The method according to claim 1, wherein:
   the barrier layers are made of a material including SiN, SiNO, or a combination thereof.

3. The method according to claim 1, wherein:
   a thickness of the barrier layers is about 5 Å to about 20 Å.

4. The method according to claim 1, further including:
   before forming the first mask groove and the second mask groove, forming a separation mask layer on the barrier region of the first mask material layer;
   etching a portion of the first mask material layer at the two sides of the barrier region by using the separation mask layer as a mask, to form the first mask groove and the second mask groove in the first mask material layer; and
   before forming the first mask through hole, removing the separation mask layer.

5. The method according to claim 4, wherein:
   the separation mask layer is made of a material including TiN, AlN, CuN, BN, or a combination thereof.

6. The method according to claim 4, further including removing the separation mask layer before forming the barrier layers.

7. The method according to claim 6, wherein:
   before forming the first mask material layer, a second mask material layer is formed on the to-be-etched layer;
   the first mask material layer is disposed on the second mask material layer;
   the second mask material layer at a bottom of the first mask groove, at a bottom of the second mask groove, and at a bottom of the first mask through hole, is etched, to form a third mask groove in the second mask material layer at the bottom of the first mask groove, form a fourth mask groove in the second mask material layer at the bottom of the second mask groove, and form a second mask through hole in the second mask material layer at the bottom of the first mask through hole; and
   etching the to-be-etched layer by using the barrier layers, the first mask material layer and the second mask material layer as a mask, to form the first groove in the to-be-etched layer at a bottom of the first mask groove and the third mask groove, the second groove in the to-be-etched layer at the bottom of the second mask groove and the fourth mask groove, and the through hole in the to-be-etched layer at the bottom of the first mask through hole and the second mask through hole.

8. The method according to claim 4, further including:
after forming the barrier layers, removing the separation mask layer by etching, wherein:
before removing the separation mask layer, the barrier layers remain at sidewalls of the separation mask layer.

9. The method according to claim 8, wherein:
before forming the first mask material layer, a second mask material layer is formed on the to-be-etched layer;
the first mask material layer is disposed on the second mask material layer;
the second mask material layer at a bottom of the first mask groove, at a bottom of the second mask groove, and at a bottom of the first mask through hole, is etched, to form a third mask groove in the second mask material layer at the bottom of the first mask groove, form a fourth mask groove in the second mask material layer at the bottom of the second mask groove, and form a second mask through hole in in the second mask material layer at the bottom of the first mask through hole; and
etching the to-be-etched layer by using the barrier layers, the first mask material layer and the second mask material layer as a mask, to form the first groove in the to-be-etched layer at a bottom of the first mask groove and the third mask groove, the second groove in the to-be-etched layer at the bottom of the second mask groove and the fourth mask groove, and the through hole in the to-be-etched layer at the bottom of the first mask through hole and the second mask through hole.

10. The method according to claim 9, wherein the separation mask layer and the second mask material layer are formed by a same material.

11. The method according to claim 9, further including:
before forming the first mask through hole, forming a second planarized layer on the first mask material layer, on the barrier layers, in the third mask groove, and in the fourth mask groove;
forming a second bottom anti-reflection layer on the second planarized layer;
forming a second photoresist layer on the second bottom anti-reflection layer, wherein the second photoresist layer has a second opening on the barrier region;
etching second bottom anti-reflection layer and the second planarized layer at a bottom of the second opening by using the second photoresist layer as a mask until exposing the top surface of the barrier region in the first mask material layer, to form a second middle opening in the second planarized layer at the bottom of the second opening;
etching a portion of the barrier region of the first mask material layer at a bottom of the second middle opening using the barrier layers and the second planarized layer as a mask, to form a first mask through hole in the barrier region of the first mask material layer;
etching a portion of the second mask material layer at a bottom of the first mask through hole by using the barrier layers and the second planarized layer as a mask, to form a second mask through hole; and
before etching the to-be-etched layer by using the barrier layers, the first mask material layer and the second mask material layer as a mask, removing the second planarized layer, the second bottom anti-reflection layer and the second photoresist layer.

12. The method according to claim 9, wherein the second mask material layer is made of a material including TiN, AlN, CuN, BN, or a combination thereof.

13. The method according to claim 1, wherein the first mask material layer is made of a material including $SiO_2$, SiNO, or a combination thereof.

14. The method according to claim 1, further including:
forming a first conductive layer in the first groove;
forming a second conductive layer in the second groove; and
forming a conductive plug in the through hole.

15. A semiconductor device, formed according to the method of claim 1.

16. The method according to claim 1, wherein:
the barrier layers are further formed on sidewalls of the first mask groove and sidewalls of the second mask groove.

17. The method according to claim 1, wherein:
the barrier layers completely covers the exposed sidewalls of the barrier region and isolate the first mask groove and the second mask groove from the barrier region.

18. The method according to claim 1, wherein:
a distance between the first mask through hole and the first mask groove substantially equals to a distance between the first mask through hole and the second mask groove.

19. A fabrication method of a semiconductor device, comprising:
providing a to-be-etched layer;
forming a first mask material layer on the to-be-etched layer, wherein the first mask material layer includes a barrier region;
forming a first mask groove and a second mask groove separated from each other in the first mask material layer, wherein:
the first mask groove and the second mask groove extend along an extending direction parallel to an arrangement direction of the first mask groove and the second mask groove;
the first mask groove and the second mask groove are disposed at two sides of the barrier region respectively; and
the first mask groove and the second mask groove expose two sidewalls of the barrier region along the extending direction of the first mask groove;
forming barrier layers on exposed sidewalls of the barrier region;
forming a first mask through hole in the barrier region of the first mask material layer by etching a portion of the barrier region of the first mask material layer by using the barrier layers as a mask;
after forming the first mask through hole, etching the to-be-etched layer by using the barrier layers and the first mask material layer as a mask, to form a first groove in the to-be-etched layer at a bottom of the first mask groove, a second groove in the to-be-etched layer at a bottom of the second mask groove, and a through hole in the to-be-etched layer at a bottom of the first mask through hole;
before forming the first mask groove and the second mask groove, forming a separation mask layer on the barrier region of the first mask material layer;
etching a portion of the first mask material layer at the two sides of the barrier region by using the separation mask layer as a mask, to form the first mask groove and the second mask groove in the first mask material layer;

before forming the first mask through hole, removing the separation mask layer;

before etching the portion of the first mask material layer at two sides of the barrier region by using the separation mask layer as the mask:
- forming a first planarized layer on the first mask material layer and on the separation mask layer;
- forming a first bottom anti-reflection layer on the first planarized layer;
- forming a first photoresist layer with a first opening on the first bottom anti-reflection layer, wherein the first opening is disposed on the separation mask layer and on a portion of the first mask material layer at sides of the separation mask layer;
- etching the first bottom anti-reflection layer and the first planarized layer at a bottom of the first opening, to expose a top surface of the first mask material layer and a top surface of the separation mask layer and to form first middle openings in the first planarized layer at the bottom of the first opening, wherein the first middle openings are disposed at sides of the separation mask layer respectively;
- etching the first mask material layer at bottoms of the first middle openings by using the first planarized layer and the separation mask layer as a mask, to form the first mask groove and the second mask groove in the first mask material layer, wherein the first mask groove and the second mask groove are disposed at two sides of the separation mask layer respectively; and
- before removing the separation mask layer, removing the first planarized layer, the first bottom anti-reflection layer, and the first photoresist layer.

20. The method according to claim 19, wherein:
the barrier layers are made of a material including SiN, SiNO, or a combination thereof.

\* \* \* \* \*